United States Patent [19]

Hoffmann et al.

[11] Patent Number: 4,710,446

[45] Date of Patent: Dec. 1, 1987

[54] PHOTOSENSITIVE RECORDING MATERIALS

[75] Inventors: Gerhard Hoffmann, Otterstadt; Reiner Hofmann, Ludwigshafen; Albert Elzer, Otterstadt, all of Fed. Rep. of Germany

[73] Assignee: BASF Aktiengesellschaft, Fed. Rep. of Germany

[21] Appl. No.: 701,536

[22] Filed: Feb. 14, 1985

[30] Foreign Application Priority Data

Feb. 18, 1984 [DE] Fed. Rep. of Germany ....... 3405959

[51] Int. Cl.$^4$ ............................................. G03C 1/495
[52] U.S. Cl. ................................... 430/281; 430/302; 430/910; 526/318.1; 526/272
[58] Field of Search ...................... 430/302, 910, 281; 526/318.1, 272, 318

[56] References Cited

U.S. PATENT DOCUMENTS

| | | | |
|---|---|---|---|
| 3,551,357 | 12/1970 | Corte et al. | 526/318.1 |
| 3,751,259 | 8/1973 | Bauer et al. | 204/159.18 X |
| 3,804,631 | 4/1974 | Faust | 204/159.16 |
| 3,862,265 | 1/1975 | Steinkamp et al. | 525/193 X |
| 3,887,450 | 6/1975 | Gilano et al. | 204/159.16 |
| 3,953,309 | 4/1976 | Gilano et al. | 204/159.16 |
| 4,252,880 | 2/1981 | Lind et al. | 430/82 |

FOREIGN PATENT DOCUMENTS

| | | |
|---|---|---|
| 0049504 | 3/1981 | European Pat. Off. . |
| 1117391 | 3/1959 | Fed. Rep. of Germany . |
| 2718047 | 3/1979 | Fed. Rep. of Germany . |
| 1521322 | 8/1978 | United Kingdom . |

OTHER PUBLICATIONS

Abstract, U.S. Pat. No. 2,539,377.

*Primary Examiner*—John D. Welsh
*Attorney, Agent, or Firm*—Keil & Weinkauf

[57] ABSTRACT

A photosensitive recording material, in particular for the production of lithographic printing plates or resist images, possesses a photosensitive, photopolymerizable or electrophotographic recording layer which can be washed out with an aqueous, in particular aqueous alkaline, medium, the said recording layer containing, as a polymeric binder, a copolymer which is soluble or dispersible in the aqueous, in particular aqueous alkaline, medium and which contains, as a comonomer, an anhydride of a polymerizable, ethylenically unsaturated monocarboxylic acid in an amount of from 0.05 to 2% by weight, based on the copolymer, as copolymerized units.

10 Claims, No Drawings

PHOTOSENSITIVE RECORDING MATERIALS

The present invention relates to photosensitive recording materials, in particular for the production of lithographic printing plates or resist images, possessing a photosensitive recording layer which is applied on a base, contains a polymeric binder and can be developed with an aqueous, in particular aqueous alkaline, medium.

Photosensitive recording materials which can be washed out with water or, in particular, an aqueous alkaline medium and are intended for the production of lithographic printing plates or resist images are known. They generally contain a photosensitive recording layer, containing a polymeric binder, on a dimensionally stable base, e.g. an aluminum sheet or a plastic film. The polymeric binders used are, in particular, copolymers which are soluble or dispersible in aqueous, preferably aqueous alkaline, media, e.g. styrene/maleic anhydride copolymers, styrene/maleic half ester copolymers, (meth)acrylate/(meth)acrylic acid copolymers or copolymers of styrene, (meth)acrylates and (meth)acrylic acid, with or without other comonomers.

In photopolymerizable recording materials as used in particular for the production of photopolymeric lithographic printing plates or resist images, the photosensitive photopolymerizable recording layer contains not only the polymeric binders which are soluble or dispersible in aqueous media but usually also one or more ethylenically unsaturated, photopolymerizable, low molecular weight compounds, one or more photopolymerization initiators and, if required, further additives and/or assistants, e.g. thermal polymerization inhibitors, dyes, pigments, sensitometric regulators, plasticizers, fillers, etc. Such photopolymerizable recording materials which can be developed with an aqueous medium are described in, inter alia, DE-B-20 27 467, DE-B-20 64 080, DE-A-22 05 146, DE-A-26 02 410 and EP-A-49 504.

In electrophotographic recording materials which can be developed with an aqueous medium, a photosensitive, photoconductive recording layer is applied on an electrically conductive base, the said layer containing not only the polymeric binder which is soluble or dispersible in an aqueous medium but also one or more charge carrier-producing compounds or sensitizers, one or more charge carrier-transporting compounds and, if required, further additives. The relevant prior art includes, for example, DE-B-1 117,391, EP-B-4944 and DE-A-32 15 968.

These conventional photosensitive recording materials of the type under discussion are unsatisfactory with regard to a number of their properties. For example, it is precisely for offset layers, which are usually less than 2 μm thick, that the film-forming properties of the photosensitive recording layer are frequently inadequate, or the recording layer is too brittle or its abrasion-resistance is too low. If an attempt is made to compensate for these disadvantages by, for example, increasing the molecular weight of the polymeric binders, other advantageous properties of the recording materials, in particular the development times, are adversely affected. DE-B-27 18 047 describes photopolymerizable mixtures which can be developed with water and are intended for the production of lithographic printing plates or photoresist layers, the said mixtures containing, as a binder, a relatively high molecular weight water-soluble methacrylic acid polymer possessing not less than 70% of methacrylic acid units. This makes it possible to use water alone to develop the recording materials produced with these photopolymerizable mixtures, but these recording materials, too, are unsatisfactory in respect of their overall spectrum of properties and in particular because of the relatively long development times required.

It is an object of the present invention to provide novel photosensitive recording materials, in particular for the production of lithographic printing plates or resist images, which recording materials can be developed with water and possess a balanced advantageous combination of properties. It is a further object of the present invention to provide recording materials of this type whose pohotosensitive recording layer possesses good mechanical properties both before and after development, and which at the same time exhibit very good washout behavior without their general profile of properties being adversely affected.

We have found that these objects are achieved by photosensitive recording materials whose photosensitive recording layer contains, as the polymeric binder, a copolymer which is soluble or dispersible in an aqueous medium and contains, as a copolymerized comonomer, a small amount of the anhydride of a polymerizable monocarboxylic acid.

The present invention accordingly relates to a photosensitive recording material, in particular for the production of lithographic printing plates or resist images, possessing a photosensitive recording layer which contains a polymeric binder and can be developed with an aqueous, in particular aqueous alkaline, medium, wherein the photosensitive recording layer contains, as the polymeric binder, a copolymer which is soluble or dispersible in an aqueous, in particular aqueous alkaline, medium and contains, as a copolymerized comonomer, an anhydride of a polymerizable ethylenically unsaturated monocarboxylic acid in an amount of from 0.05 to 2, preferably from 0.1 to 1, %, by weight, based on the copolymer.

For the purposes of the present invention, the term "photosensitive recording material" is used to mean those recording materials which possess a photosensitive, photopolymerizable recording layer as well as those which possess a photosensitive, electrophotographic recording layer, as described in, for example, the publications cited at the outset.

The polymeric binders present, in accordance with the invention, in the photosensitive recording layers of these recording materials are copolymers which are soluble or dispersible in an aqueous, in particular aqueous alkaline, medium. Suitable comonomers for synthesizing these copolymers are in principle those which are described for this purpose in the literature. These are, in particular, copolymers of one or more vinyl monomers, which as such form water-insoluble polymers, with one or more monomers possessing free acid groups, in particular sulfo or carboxyl groups, or with cyclic anhydride groups, in particular cyclic anhydrides of ethylenically unsaturated dicarboxylic acids. Examples of vinyl monomers are vinylaromatics, e.g. styrene which is unsubstituted or substituted in the side chain or in the nucleus by, for example, alkyl groups or halogen atoms, such as α-methylstyrene, o- or p-chlorostyrene, vinyltoluene and the like; esters and amides of acrylic acid or methacrylic acid, e.g. acrylates or methacrylates of alkanols of 1 to 20 carbon atoms, such as methyl (meth- )acrylate, ethyl (meth)acrylate, butyl (meth)acrylate, hexyl (meth)acrylate, hydroxyalkyl (meth)acrylates, in particular those where hydroxyalkyl is of 2 to 6 carbon atoms, glycidyl (meth)acrylate, (meth)acrylamide and derivatives of this, and the like; (meth)acrylonitrile; vinyl acetate and vinyl propionate; vinyl chloride; vinyl alkyl ketones, in particular those where alkyl is of 1 to 4 carbon atoms; and vinyl alkyl ethers, in particular those where alkyl is of 1 to 8 carbon atoms. Examples of the second group of comonomers possessing the acidic groups, such as sulfo or free carboxyl groups, or cyclic anhydride groups are, in particular, acrylic acid, methacrylic acid, crotonic acid, maleic acid, fumaric acid, maleic half esters and maleic anhydride. Other suitable comonomers for the copolymers employed according to the invention are N-vinyllactams, in particular N-(vinylpyrrolidone and N-vinylcaprolactam.

According to the invention, the copolymers used as binders also contain, as a further copolymerized comonomer, from 0.05 to 2% by weight, based on the copolymer, of an anhydride of a polymerizable monocarboxylic acid containing ethylenically unsaturated bonds. If the copolymer contains less than 0.05% by weight of these comonomers, no significant effect on the properties of the photosensitive recording layer can be detected. If the content of these comonomers in the copolymer exceeds 2% by weight, the copolymers are, as a rule, no longer suitable for use in photosensitive recording layers. Optimal results were obtained with copolymers which contained, as copolymerized units, from 0.1 to 1, in particular from 0.2 to 0.6, %, by weight, based on the copolymer, of the anhydride of a polymerizable, ethylenically unsaturated monocarboxylic acid. Examples of the said anhydrides are, in particular, acrylic anhydride and methacrylic anhydride, as well as crotonic anhydride, dimethylacrylic anhydride and anhydrides of hydroxycarboxylic acids, e.g. glycolic acid, and aminocarboxylic acids, e.g. glycine, whose hydroxyl or amino groups have been reacted with suitable polymerizable ethylenically unsaturated compounds, e.g. (meth)acrylic acid or (meth)acrylamide. The last-mentioned group of comonomers includes, for example, (meth)acrylamidoglycolic anhydride and glycolic anhydride di(meth)acrylate.

Preferred polymeric binders for the photosensitive recording materials are copolymers which are soluble or dispersible in an aqueous, in particular aqueous alkaline, medium and which contain not only the amount, according to the invention, of an anhydride of an ethylenically unsaturated monocarboxylic acid as a comonomer but also, as copolymerized units, one or more, preferably two or more, monomers from the group consisting of styrene, alkyl (meth)acrylates, (meth)acrylamide, hydroxyalkyl (meth)acrylates, vinyl acetate, N-vinylpyrrolidone, (meth)acrylic acid, maleic anhydride and maleic half esters. Examples of very suitable copolymers are those which, in addition to the amount, according to the invention, of the anhydride of an ethylenically unsaturated monocarboxylic acid and, if appropriate, further comonomer building blocks, contain the following comonomers as copolymerized units: styrene and maleic anhydride; styrene and maleic half esters; styrene, maleic anhydride and maleic half esters; styrene, maleic anhydride and acrylic acid and/or, preferably, methacrylic acid; (meth)acrylates and acrylic acid and/or, preferably, methacrylic acid; styrene, (meth)acrylates, and acrylic acid and/or, preferably, methacrylic acid. In each case, the preferred anhydride of an ethylenically unsaturated monocarboxylic acid is acrylic anhydride, methacrylic anhydride or crotonic anhydride. Copolymers which have proven particularly advantageous are those which contain, as copolymerized units, from 5 to 70% by weight of styrene, from 5 to 50% by weight of acrylic acid and/or, preferably, methacrylic acid, from 5 to 50% by weight of maleic anhydride, from 0.05 to 2% by weight of acrylic anhydride or, preferably, methacrylic anhydride and from 0 to 30% by weight of other comonomers, e.g. vinyl acetate, (meth)acrylates or the like, the percentages in each case being based on the weight of the copolvmer. Other very useful copolymers are those consisting of from 5 to 70% by weight of styrene, from 5 to 50% by weight of alkyl (meth)acrylates, from 5 to 50% by weight of acrylic acid and/or, preferably, methacrylic acid, from 0.05 to 2% by weight of (meth)acrylic anhydride and from 0 to 30% by weight of other comonomers, in particular hydroxyalkyl (meth)acrylates or the like.

Essentially the only difference between the composition of the copolymers used, according to the invention, as polymeric binders and that of the conventional polymeric binders of this type is the incorporation of a small amount of an anhydride of a polymerizable monocarboxylic acid containing ethylenically unsaturated bonds, which results in a higher molecular weight. The photosensitive recording layers prepared using the novel copolymers as binders possess better mechanical properties than the conventional materials, without the development times or other properties being adversely affected. Whereas to date it was necessary to choose relatively low molecular weight binders in order to retain ease of development, with the novel copolymers it is possible, inspite of the substantially higher molecular weight, to maintain development times which are just as short as those used to date in the case of the comparatively low molecular weight polymeric binders. According to the invention, the advantageous properties of high molecular weight binders also play a role in the recording layers.

The copolymers used according to the invention can be prepared by copolymerization of the comonomers by a conventional polymerization method, for example solution polymerization or precipitation polymerization. Examples of suitable solvents for solution polymerization are tetrahydrofuran, dimethoxyethane, dioxane and ethyl acetate, and the total concentration of the monomers should preferably be from 25 to 45% by weight, based on the solution. For precipitation polymerization, aliphatic or aromatic hydrocarbons are suitable as inert solvents; in this case, the concentration of the monomers is in general adjusted to from 5 to 25% by weight. Suitable polymerization initiators are the conventional free radical initiators, e.g. azobisisobutyronitrile. The polymerization temperature is in general from 50° to 100° C., preferably from 75° to 95° C.

The choice of the copolymer essentially depends on the further composition of the photosensitive recording layer and on the performance characteristics which it is required to possess. The choice can in principle be made on the basis of criteria which are identical or similar to those in the case of the conventional materials of the type under discussion, and can therefore be readily established by the skilled worker, if necessary on the basis of a few simple preliminary experiments. In the case of the electrophotographic recording materials, the copolymers employed as binders can be readily adapted to the charge carrier-transporting compounds present in the photoconductive recording layers.

Photosensitive recording materials possessing a photosensitive, photopolymerizable recording layer contain, in this layer, not only the novel polymeric binders but in general also one or more ethylenically unsaturated, photopolymerizable, low molecular weight compounds, one or more photopolymerization initiators or a photopolymerization initiator system, and, if required, further additives and/or assistants for improving and/or modifying the general properties of the recording layers or of the lithographic printing plates or resist images produced from these. In a typical embodiment, such recording layers contain, for example, from 40 to 90% by weight of the novel binder, from 5 to 50% by weight of ethylenically unsaturated, photopolymerizable, low molecular weight compounds, from 0.5 to 10% by weight of one or more photoinitiators or photoinitiator systems, from 0 to 8, preferably from 0.01 to 5, %, by weight of assistants which influence the exposure characteristics and/or polymerization properties, e.g. dyes, sensitometric regulators, thermal polymerization inhibitors, etc., and from 0 to 20% by weight of additives which improve or modify the mechanical properties, e.g. plasticizers, fillers, leveling agents, further, inert, high molecular weight or low molecular weight polymers, etc., the percentages in each case being based on the total recording layer. Suitable further components which are present in the said recording layers in addition to the novel polymeric binders are the compounds and substances as described in, inter alia, the literature cited at the outset, which are known per se and conventionally used for this purpose.

Suitable ethylenically unsaturated, photopolymerizable, low molecular weight compounds are both monomers and oligomers (having a molecular weight as high as about 5,000, in particular as high as about 3,000), and these may be either monofunctional or polyfunctional, i.e. they can possess one or more photopolymerizable ethylenic double bonds. Usually, the photosensitive, photopolymerizable recording layer contains bifunctional or polyfunctional compounds of this type, alone or as a mixture with monofunctional compounds of this type. Typical examples of ethylenically unsaturated, photopolymerizable, low molecular weight compounds which can be used alone or as a mixture with one another are allyl and vinyl compounds as well as, in particular, the derivatives of (meth)acrylic acid and, very particularly, the (meth)acrylates. Examples of very useful ethylenically unsaturated, photopolymerizable, low molecular weight compounds are the di- and tri-(meth)acrylates of ethylene glycol, diethylene glycol, triethylene glycol and polyethylene glycols having a molecular weight as high as about 500, propane-1,2-diol, propane-1,3-diol, butane-1,4-diol, 1,1,1-trimethylolpropane, neopentylglycol (2,2-dimethylpropanediol), glycerol and pentaerythritol; glucose tri- and tetra-(meth)acrylate; the monoacrylates and monomethacrylates of the stated diols and polyols, e.g. ethylene glycol mono(meth)acrylate or di- tri- or tetraethyleneglycol mono(meth)acrylate, and the (meth)acrylates of monoalkanols, in particular those of 1 to 20 carbon atoms; and monomers which contain two or more ethylenically unsaturated bonds and urethane and/or amide groups, e.g. the urethane (meth)acrylates prepared from aliphatic diols of the above type, organic diisocyanates and hydroxyalkyl (meth)acrylates. Other examples are compounds such as N-vinylpyrrolidone, N-vinylcaprolactam, vinyl acetate and propionate, (meth)acrylamide, N-methylol(meth)acrylamide, the bis-ethers of ethylene glycol and N-methylol(meth)acrylamide, vinyl carbamates, bisacrylamidoacetic acid, glyoxalbisacrylamide and others. The ethylenically unsaturated, photopolymerizable, low molecular weight compounds chosen are compatible with the polymeric binder used.

Particularly suitable photoinitiators for the photosensitive, photopolymerizable recording layers are the photoinitiators or photoinitiator systems conventionally used for the production of offset printing plates or resist layers. Examples of suitable photoinitiators, in addition to compounds such as benzoin, are the benzoin derivatives, e.g. benzoin ethers, the substituted benzoins, substituted benzoin derivatives, e.g. substituted benzoin ethers, benzils, in particular benzil ketals, and the acylphosphine oxide compounds, in particular compounds of the benzophenone type and its derivatives, such as benzophenone, 4,4'-dimethylaminobenzophenone, 4,4'-diethylaminobenzophenone, derivatives of Michler's ketone, 4,4'-dichlorobenzophenone, etc., and mixtures of these; anthraquinones, such as 2-ethylanthraquinone, tert.-butylanthraquinone, etc.; bisimidazole derivatives, such as 2,4,5-triarylimidazole dimers; 2-chlorothioxanthone, and the acridine and phenazine derivatives which are effective as photoinitiators. Examples of initiator systems are combinations of the stated initiators with sensitizers, in particular tertiary amines. Typical examples of such initiator systems are combinations of benzophenone or benzophenone derivatives with tertiary amines, such as triethanolamine or Michler's ketone; or mixtures of 2,4,5-triarylimidazole dimers and 2-mercaptobenzoquinazole, leuco crystal violet, tris-(4-diethylamino-2-methylphenyl)-methane and the like. The selection of suitable photoinitiators or photoinitiator systems is familiar to the skilled worker.

Suitable further additives and/or assistants for the photosensitive, photopolymerizable recording layers are dyes and/or pigments which can both act as contrasting agents and strengthen the layer. Suitable dyes as described in, inter alia, U.S. Pat. Nos. 3,218,167 and 3,884,693, include, for example, Victoria Pure Blue FGA, Victoria Pure Blue BO (C.I. 42,959), malachite green, crystal violet, Victoria Blue B (C.I. 44,045), Rhodamine 6 GDN (C.I. 45,160) and others, as well as the leuco bases of the triarylmethane dyes, e.g. malachite green leuco base or crystal violet leuco base, and Rhodamine B base. The further additives and/or assistants also include the thermal polymerization inhibitors, e.g. hydroquinone and its derivatives, 2,6-di-tert.-butyl-p-cresol, nitrophenols, N-nitrosoamines, such as N-nitrosodiphenylamine or the salts of N-nitrosocyclohexylhydroxylamine. The photosensitive, photopolymerizable recording layers may furthermore contain, for example, the sensitometric regulators described in the literature, e.g. 9-nitroanthracene, 10,10'-bisanthrones, phenazinium, phenoxazinium, acridinium or phenothiazinium dyes, 1,3-dinitrobenzenes and the like. Other suitable additives and/or assistants are, for example, fillers, reinforcing agents, further binders which improve the mechanical properties, plasticizers, leveling agents and the like.

The said recording layers can be produced by the conventional methods; advantageously, they are applied, from a very homogeneous solution in a suitable organic solvent, onto the particular base in such a manner that, when the solvent has been evaporated in the air, the resulting dry layer is about 0.1–50 μm thick. The thickness of the dry layer essentially depends on the intended use of the photosensitive recording materials and is, in particular, from 0.7 to 3.5 μm for the production of lithographic printing plates. For the production of resist images, it is possible to use both very thin layers and thicker resist layers, for example about 5–50 μm.

In the case of the photosensitive, electophotographic recording materials possessing a photosensitive, photoconductive recording layer, the latter contains not only the novel binders as a homogeneous dispersion, but also one or more charge carrier-transporting compounds, one or more compounds which produce charge carriers when exposed to actinic light, or one or more sensitizers, and, if required, further inert additives and/or assistants which improve or modify the performance characteristics and in particular the mechanical properties. In a commonly used, advantageous embodiment, the photosensitive, photoconductive recording layer contains, for example, from 45 to 75% by weight of the novel binder, from 25 to 50% by weight of the charge carrier-transporting compounds, from 0.05 to 2% by weight of the charge carrier-producing compounds or the sensitizers, and from 0 to 25% by weight of further conventional additives and/or assistants which improve and/or modify, in particular, the mechanical properties of the recording layer, the percentages in each case being based on the total photosensitive, photoconductive recording layer. If further additives and/or assistants are present in this layer, the amount of these is in general not less than 2% by weight, based on the recording layer. Components which are present, in addition to the novel polymeric binders, in the photosensitive, photo-conductive recording layers can be the compounds and substances, as described in, inter alia, the literature cited at the outset, which are conventionally used for electrophotographic recording materials possessing singlelayer photoconductive recording layers.

Suitable charge carrier-transporting compounds are both low molecular weight and polymeric aromatic, e.g. heterocyclic, compounds. Examples include oxazole derivatives (DE-B-11 20 875), oxadiazole derivatives (DE-B-10 58 836), triazole derivatives (DE-B-10 60 260), azomethines (US-A-3 041 165), pyrazoline derivatives (DE-B-10 60 714) and imidazole derivatives (DE-B-11 06 599). Benzotriazole derivatives, in particular 2-(4'-aminophenyl)-1,2,3-benzotriazoles, as described in, for example, DE-A-32 15 968 or DE-A-33 24 641, have proven very advantageous. Hydrazone derivatives, as described in, for example, DE-A-32 01 202, also give very good results. Suitable polymeric charge-transporting compounds, in addition to vinylaromatic polymers such as polyvinyl anthracene, are, in particular, poly(N-vinylcarbazole) and copolymers of N-vinylcarbazole with a predominant content of the latter. The charge carrier-transporting compounds should in general be highly compatible with the polymeric binder of the photosensitive, photoconductive recording layer when used in the required amount.

Particularly suitable charge carrier-producing compounds or sensitizers for the novel single-layer photosensitive, photoconductive recording layers are the conventional sensitizing dyes, for example dyes from the triarylmethane series, xanthene dyes and cyanine dyes. Very good results were obtained using Rhodamine B (C.I. 45 170), Rhodamine 6 G (C.I. 45 160), malachite green (C.I. Basic Green 4; C.I. 42 000), methyl violet (C.I. 42 535), crystal violet (C.I. 42 555), Astrazon Orange R (C.I. 48 040), C.I. Basic Red 12 (C.I. 48 070), C.I. Fanal Violet 3 R supra and Astra Yellow R (C.I. Basic Yellow 44). The sensitizing dyes can be used alone or as a mixture with one another; in order to achieve panchromatic sensitization, it may be advantageous to employ a mixture of sensitizing dyes which absorb in different wavelength ranges of actinic light, for example a mixture of triarylmethane dyes and cyanine dyes.

The photosensitive, photoconductive recording layer of the electrophotographic recording materials may furthermore contain additives conventionally employed for the particular application, e.g. leveling agents, plasticizers and further high molecular weight or low molecular weight polymers.

The said recording layers can be produced using a conventional method; advantageously, they are applied, from about 5% strength by weight solution in a suitable solvent, onto the particular base in such a manner that, when the solvent has been dried in the air, the resulting dry layer is about 0.1–50 μm thick (for electrophotographic printing plates, in particular lithographic printing plates, preferably about 1–6 μm, depending on the intended use).

Suitable bases for the photosensitive recording layers are the dimensionally stable rigid or, preferably, flexible bases conventionally used for photosensitive recording materials of the type under discussion, the type of base also depending on the intended use. For example, plastic films, e.g. polyester films, are preferably used as bases for dry film resists which consist of, in particular, photosensitive, photopolymerizable recording layers. For photosensitive electrophotographic recording materials, the base used can in principle be any electrically conductive base, provided that it is suitable for the particular field of use. Preferred bases for the novel photosensitive recording materials are metallic bases, for example those consisting of aluminum, magnesium, zinc, copper or polymetallic sheets, which can be used as such or in a form which has been pretreated mechanically, chemically, electrochemically and/or by providing it with a mixture of adhesive-forming components. Other suitable bases are polymer films possessing a metallized surface, e.g. polyethylene terephthalate films coated with aluminum by vapor deposition, or special electrically conductive papers. When the novel photosensitive recording materials are used in the production of printing papers, in particular lithographic printing plates, preferably used bases are aluminum sheets or films which advantageously have been superficially roughened mechanically or electrochemically and may or may not have been subsequently anodized. Bases for printing plates are advantageously about 0.08–0.3 mm thick.

A further layer, for example one which is about 0.03–5 μm thick, can be located between the base and the photosensitive recording layer in order to improve the adhesion and/or, for example, the electrophotographic properties. Particularly in the case of the photosensitive, photopolymerizable recording materials, a covering layer or cover sheet may also be located on top of the photosensitive recording layer, the said cover sheet preferably being soluble in the same developer as that used for the photosensitive recording layer, or being capable of being peeled off from this before the development. This cover sheet serves in particular to protect the photosensitive recording layer during storage and handling of the photosensitive recording materials, and also as an oxygen barrier for the photosensitive photopolymerizable recording layers. For example, covering layers consisting of polyvinyl alcohols or derivatives of these, or cover sheets consisting of polyolefins, e.g. polyethylene, have proven particularly useful.

The novel photosensitive recording materials can advantageously be used for the production of lithographic printing plates or resist images by the methods conventionally used for this purpose.

To produce the photosensitive recording materials possessing a photosensitive, photopolymerizable recording layer, the latter is first exposed imagewise to actinic light, suitable light sources for this purpose being the conventional sources of actinic light, e.g. UV fluorescent tubes, mercury high pressure, medium pressure or low pressure lamps, superactinic fluorescent tubes and pulsed xenon lamps, as well as UV lasers, argon lasers and the like. The wavelength emitted by the light sources should be in general from 230 to 450 nm, preferably from 300 to 420 nm, and should be matched up with, in particular, the characteristic absorption of the photoinitiator present in the photosensitive recording layer. The imagewise exposure to actinic light initiates photopolymerization in the exposed areas of the recording layer, and this photopolymerization results in crosslinking and hence differentiation between the solubility of the exposed areas of the layer and that of the unexposed areas. After imagewise exposure, the lithographic printing plate or the resist image is developed by washing out the unexposed, non-crosslinked areas of the recording layer with a suitable developer.

The production of lithographic printing plates using the novel photosensitive, electrophotographic recording materials is carried out in a conventional manner, by electrostatic charging of the electrophotographic recording material by means of a high voltage corona, imagewise exposure of the photoconductive recording layer to actinic light directly thereafter, development of the electrostatic latent charge image which is present by means of a dry or liquid toner, fixing of the toner, for example by means of a subsequent fusion process, and removal of the untoned areas of the photoconductive recording layer by means of a suitable washout solution. The resulting plate can then be further processed in a conventional manner for offset printing, for example by hydrophilizing and gumming the water-bearing surface.

Development and washout of the imagewise exposed recording materials can be carried out by spraying, washing, rubbing off, brushing, etc. with the developer. Suitable developers are, depending on the type of polymeric binder employed, aqueous media, e.g. water or mixtures of water with organic solvents, e.g. alcohols, and in particular aqueous alkaline solutions which contain alkaline substances, e.g. borax, disodium hydrogen phosphate, sodium carbonate or alkali metal hydroxides, or organic bases, such as diethanolamine or triethanolamine, in order to establish an advantageous pH, which is in general from 8 to 14, preferably from 9 to 12.

The aqueous alkaline developers may furthermore contain buffer salts, for example water-soluble alkali metal phosphates, silicates, borates, acetates or benzoates. Wetting agents, preferably anionic wetting agents, and, if required, water-soluble polymers, e.g. sodium carboxymethylcellulose, polyvinyl alcohol, polysodium acrylate and the like, can be used concomitantly as further components of the developer. It is also possible for the aqueous alkaline developer to contain added amounts of water-soluble organic solvents, e.g. aliphatic alcohols, acetone or tetrahydrofuran.

The novel photosensitive recording materials possess a combination of very good properties, in particular good mechanical properties and high stability during use, coupled with good exposure characteristics and in particular short washout times. They can therefore advantageously be employed in all fields of use in reprography where easy washout coupled with good mechanical properties are desirable.

The Examples which follow illustrate the invention. Parts and percentages are by weight, unless stated otherwise. The Fikentscher K value (measured in a 1% strength solution of the particular polymer in tetrahydrofuran) was determined as a measure of the molecular weight of the polymers.

EXAMPLE 1

A 5% strength solution in tetrahydrofuran was prepared from the following components: 55 parts of a copolymer consisting of 52% of styrene, 20% of maleic anhydride, 27.6% of methacrylic acid and 0.4% of methacrylic anhydride (prepared by precipitation polymerization, K value 54.6, softening range 240°–245° C.), 37 parts of 2-(4'-diethylaminophenyl)-1,2,3-benzotriazole and 0.5 part of Rhodamine 6 G (C.I. 45,160).

This solution was applied on an aluminum base typical for offset printing, in a thickness such that, when the solvent had been evaporated in the air, a dry layer 3.5 $\mu$m thick resulted. This electrophotographic plate was electrostatically charged on the surface to −600 V, exposed imagewise for 15 seconds to light having an illuminance of 8 $\mu$Wcm$^{-2}$ in the plane of the layer, and then toned with a commercial powder toner. When the toner had been fixed, the untoned areas of the electrophotographic layer were washed off with a mixture of 0.5% of sodium carbonate, 25% of isopropanol and 74.5% of water, thereby baring the aluminum surface. This plate was gummed and then used directly for printing on an offset printing press. Satisfactory print quality was obtained, and no traces of abrasion were detectable even after prolonged printing times.

EXAMPLE 2

A 5% strength solution in dimethoxymethane was prepared using 14 parts of a copolymer consisting of 43% of styrene, 28% of methyl methacrylate, 21% of acrylic acid, 7.6% of 2-hydroxypropyl acrylate and 0.4% of methacrylic anhydride (prepared by precipitation polymerization, K value 54.3, softening point about 230° C.), 8.75 parts of trimethylolpropane triacrylate, 1.5 parts of benzophenone, 0.5 part of Michler's ketone and 0.25 part of crystal Violet (C.I. 42,555). This solution was cast on an aluminum base typical for offset printing, in such a manner that, when the solvent had been evaporated in the air, a dry layer 1.8 $\mu$m thick resulted. This layer was dried and then additionally provided with a 4.5 $\mu$m thick covering layer consisting of highly hydrolyzed polyvinyl alcohol (degree of hydrolysis: 98 mol %).

The recording material produced in this manner was exposed imagewise to a 5 kW high pressure halide lamp for 5.5 sec at a distance of 1 m, through a standard negative. The exposed plate was then washed out with an aqueous alkaline solution having a pH of 11.6 in a continuous flow washer for 25 seconds. When the offset printing plate obtained in this manner was gummed and then used for printing on an offset printing press, it gave excellent printing results without visible signs of wear.

EXAMPLE 3

To produce a dry film resist, a solution consisting of the following components was first prepared: 67 parts of a copolymer of 48% of styrene, 19% of maleic anhydride, 32.6% of acrylic acid and 0.4% of methacrylic anhydride (K value 53.5), 22 parts of trimethylolpropane triacrylate, 11 parts of tetraethylene glycol dimethacrylate, 3 parts of benzophenone, 0.3 part of Michler's ketone, 0.05 part of crystal violet leuco base and 140 parts of tetrahydrofuran. This solution was cast onto a 0.025 mm thick polyester film in such a manner that, after drying in the air, a dry layer about 25 μm thick resulted. The dried layer was then covered with a polyethylene film about 25 μm thick.

After the polyethylene cover sheet had been peeled off, the photopolymerizable layer was laminated, at 120° C. and under superatmospheric pressure, with a copper-plated baseplate as conventionally used for the production of printed circuits. The photopolymerizable layer was then exposed imagewise through the polyester film, using an appropriate photomask having the pattern of the circuit paths of a printed circuit. Exposure was carried out for 45 sec, using a 400 W/50 A mercury vapor lamp at a distance of 30 cm. The polyethylene terephthalate film was then peeled off, and the unexposed areas of the photopolymer layer were washed out for 3.5 min with a 2% strength aqueous sodium carbonate solution. The resulting resist image was faithful to the original and possessed well-defined edges. The bared areas of the copper-plated baseplate which were not covered by the resist image could be etched with a ferrichloride solution without problems. After the etching procedure, followed by washing and drying, the resist layer was removed from the remaining copper by immersion for 2 minutes in a 3% strength aqueous sodium hydroxide solution at 70° C. A plate containing a high quality printed circuit resulted.

We claim:

1. In a photosensitive recording material for the production of a printing plate or a resist image comprising a dimensionally stable base and a photosensitive recording layer containing a polymeric binder, which photosensitive layer can be developed with water or an aqueous alkaline media, the improvement which comprises using as the polymeric binder a copolymer which is soluble or dispersible in water or an aqueous alkaline medium and contains, as a copolymerized comonomer, the anhydride of the polymerizable, ethylenically unsaturated monocarboxylic acid in an amount of from 0.05 to 2% by weight, based on the copolymer, said copolymer, in addition to the anhydride of the polymerizable, ethylenically unsaturated monocarboxylic acid, containing, as further components, one or more comonomers from the group consisting of vinylaromatic monomers, acrylates and methacrylates, and one or more comonomers from the group consisting of maleic anhydride, maleic half-esters, acrylic acid and methacrylic acid.

2. A photosensitive recording material as set forth in claim 1, wherein the copolymer contains, as copolymerized units, styrene, maleic anhydride and (meth)acrylic anhydride.

3. A photosensitive recording material as set forth in claim 2, wherein the copolymer contains, as copolymerized units, styrene, maleic anhydride, (meth)acrylic acid and (meth)acrylic anhydride.

4. A photosensitive recording material as set forth in claim 1, wherein the copolymer contains as copolymerized units, (meth)acrylates, (meth)acrylic acid and (meth)acrylic anhydride.

5. A photosensitive recording material as set forth in claim 4, wherein the copolymer contains, as copolymerized units, styrene, (meth)acrylates, (meth)acrylic acid and (meth)acrylic anhydride.

6. A photosensitive recording material as set forth in claim 1, wherein the photosensitive recording layer is photopolymerizable and, in addition the polymeric binder, contains one or more photopolymerizable, ethylenically unsaturated, low molecular weight compounds and one or more photoinitiators or a photoinitiator system.

7. A photosensitive recording material as set forth in claim 1, comprising, as an electrophotographic recording material, a photosensitive, photoconductive recording layer which, in addition to the polymeric binder, contains one or more charge carrier-transporting compounds and one or more charge carrier-producing compounds or sensitizers.

8. A photosensitive recording material as set forth in claim 7, wherein the photoconductive recording layer contains, as charge carrier-transporting compounds, triazole derivatives or hydrazone derivatives.

9. A photosensitive recording material as set forth in claim 7, wherein the photoconductive recording layer contains sensitizing dyes as charge carrier-producing compounds or sensitizers.

10. A photosensitive recording material as defined in claim 1, wherein the copolymer contains up to 30% by weight of additional comonomer as copolymerized units.

* * * * *